United States Patent [19]

Karas et al.

[11] Patent Number: 4,874,635

[45] Date of Patent: Oct. 17, 1989

[54] METHOD FOR REMOVING RESIDUAL PRECIOUS METAL CATALYST FROM THE SURFACE OF METAL-PLATED PLASTICS

[75] Inventors: Bradley R. Karas, Amsterdam; Donald F. Foust, Scotia; William V. Dumas, Delanson, all of N.Y.

[73] Assignee: General Electric Company, Schenectady, N.Y.

[21] Appl. No.: 177,254

[22] Filed: Apr. 4, 1988

[51] Int. Cl.$^4$ .............................................. H05K 3/46
[52] U.S. Cl. ...................................... 427/96; 427/306; 134/26; 134/28; 134/29; 502/22; 502/25; 502/27
[58] Field of Search ............... 134/26, 28, 29; 427/96, 427/306; 502/22, 25, 27

[56] References Cited

U.S. PATENT DOCUMENTS

| | | | |
|---|---|---|---|
| 4,430,154 | 2/1984 | Stahl | 134/28 |
| 4,515,829 | 5/1985 | Deckert et al. | |
| 4,735,820 | 4/1988 | Agostino | 427/98 |
| 4,756,930 | 7/1988 | Kukanskis | 427/98 |
| 4,770,899 | 9/1988 | Zeller | 427/96 |

OTHER PUBLICATIONS

"A Brief History", a product brochure for Shipley Company.
"Circuposit® MLB Promoter 213", a product brochure for Shipley Company.
"Circuposit® MLB Process", a product brochure for Shipley Company.

*Primary Examiner*—Sam Silverberg
*Attorney, Agent, or Firm*—William H. Pittman; James C. Davis, Jr.

[57] ABSTRACT

A method for removing residual precious metal catalyst from a plastic, metal-plated surface is disclosed. The method involves the oxidation of the precious metal without degrading the plated metal or the plastic, followed by washing away the oxidized precious metal. This invention further includes methods for the plating of metal directly on the surface of a plastic substrate.

23 Claims, No Drawings

METHOD FOR REMOVING RESIDUAL PRECIOUS METAL CATALYST FROM THE SURFACE OF METAL-PLATED PLASTICS

BACKGROUND OF THE INVENTION

This invention relates generally to the plating of metal on a plastic surface, and more particularly to methods for chemically treating a thermoplastic substrate upon which a printed circuit is formed by various plating and patterning techniques.

Printed circuit boards are now the predominant vehicle for mounting and interconnecting electronic components to form a desired electronic circuit. The printed circuit board typically consists of a sheet of a dielectric substrate constructed of various filled or unfilled synthetic materials such as phenolics and glass-impregnated epoxies. The substrate is usually provided with a pattern of thin metal foil which functions as a conductive path or "trace" on one or both sides. The traces collectively define all of the electrical connections between components on the board, and are routed between appropriate locations.

Traditionally, printed circuit boards have been produced by laminating a metal such as copper to one or both sides of a reinforced plastic board. "Through-holes" are then drilled through the board, followed by catalysis of the surface surrounding the through-hole in preparation for electroless plating with a metal. After the electroless deposition, the metal surface is patterned, imaged, and developed. The metal thickness is then built up on the board surface and in the holes by electroplating, followed by etching and removal of the photoresist to produce the desired circuit pattern. The etching mask is often a tin/lead mixture. In this type of circuit board production, the precious metal catalyst never contacts the background regions of the substrate, i.e., the regions which are free of metal in the final product.

In recent years, the use of thermoplastic substrates such as polysulfones and polyimides has considerably advanced printed circuit board technology. These materials are particularly suitable because of their strength, heat resistance, dimensional stability, and easy moldability. In this process, the cumbersome metal lamination step is eliminated because the plastic substrates can be metallized directly by electroless plating. Furthermore, the need for drilling through-holes is also eliminated because such holes are already formed during the plastic molding process. The disadvantages attendant with drilling, such as the presence of melted plastic drilling debris ("smear"), and the general degradation of the plastic beyond the drilled edge, are also advantageously eliminated.

While the advent of directly-metallized plastic circuit board substrates has greatly enhanced the art, several new problems have arisen. For example, in preparation for electroless plating, a precious metal catalyst is employed to activate the plastic surface. After plating and patterning of the circuit metal are accomplished, portions of the catalyst remain tightly adherent to the substrate. Since the catalyst metal is conductive, it can function as an electrical pathway between adjacent traces in the circuit pattern, thereby resulting in current leakage during operation of the circuit. Furthermore, additional layers of metal subsequently applied to the substrate may preferentially adhere to areas which include the residual catalyst, thereby inviting current leakage or short circuits. In summary, the presence of residual plating catalysts can greatly impair the integrity of the electrical circuit.

Attempts to remove the residual precious metal catalyst unfortunately invite other complications. For example, the etching solutions used to remove selected portions of the plated metal are not aggressive enough to remove the catalyst, which is typically a fairly nonreactive metal such as palladium. More aggressive solutions could remove the residual catalyst, but only by sacrificing portions of the desired metal pattern. Furthermore, strong cleaning solutions, such as those which are highly acidic or highly basic, can chemically attack both the etching mask and the underlying plastic substrate, thereby damaging the circuit board.

It is therefore the primary objective of the present invention to provide a method for removing residual precious metal catalyst from the surface of a plastic circuit board without degrading the printed circuit.

An additional objective of this invention is to provide a method for precious metal catalyst removal which does not result in damage to plastic material in contact with the precious metal.

A further objective of the present invention is to provide a method for forming a high quality circuit pattern of metal directly applied to a plastic substrate.

SUMMARY OF THE INVENTION

The present invention is a method for removing residual precious metal catalyst from a plastic, metal-plated surface, comprising oxidation of the precious metal without substantial degradation of the plated metal, followed by washing away the oxidized precious metal. This treatment may be used wherever the presence of residual precious metal catalyst will cause any of the problems discussed above. The invention further includes methods for the plating of metal on a plastic surface, in which the plated surface is made free of residual precious metal catalyst.

DETAILED DESCRIPTION OF THE INVENTION

Oxidation of the residual precious metal catalyst according to this invention depends in part on the particular catalyst being used. The catalyst is usually in the form of a liquid solution of gold, platinum, palladium, or silver. In general, this invention requires strong oxidizing materials which do not damage the plastic substrate or the metallic pattern applied thereon. The oxidizing strength in reference to a particular oxidizable precious metal is measured by the standard potential of the oxidizing agent within a particular carrier solution. The required standard potential as measured against a standard hydrogen electrode depends on whether the carrier solution is acidic or basic. An acidic solution as used herein is defined as one having a pH less than 7.0, while a basic solution is one having a pH greater than 7.0. In the case of a palladium precious metal catalyst, the oxidizing agent should have a standard potential of at least about 0.83 volt in an acidic medium, and should have a standard potential of at least about 0.16 volt when used in a basic medium. In general, the oxidizing agent as incorporated into an aqueous solution has a standard potential equal to or greater than the standard potential for the half-reaction of the precious metal under a pH influence corresponding to the pH of the aqueous solution.

The following standard potential values for the oxidizing agents should be used in the case of the other catalysts mentioned above:

TABLE 1

| Standard Potentials for Oxidizing Agents | | |
|---|---|---|
| Precious Metal Catalyst | Type of Carrier Solution for Oxidizing Agent[a] | Minimum Required Standard Potential[b] |
| Palladium | Basic | about 0.16 |
| Palladium | Acidic | about 0.83 |
| Platinum | Basic | about 0.14 |
| Platinum | Acidic | about 1.20 |
| Gold | Basic | about 0.40 |
| Gold | Acidic | about 1.41 |
| Silver | Basic | about 0.34 |
| Silver | Acidic | about 0.80 |

[a]The required standard potential for a neutral carrier solution can be determined without undue experimentation, based on the acidic and basic values provided above.
[b]Versus standard hydrogen electrode.

Examples of oxidizing agents suitable for the present invention include permanganate salts such as potassium permanganate ($KMnO_4$) or sodium permanganate ($NaMnO_4$); hypochlorite salts such as sodium hypochlorite, potassium hypochlorite, and calcium hypochlorite; peroxides such as hydrogen peroxide and sodium peroxide; and ceric salts such as ceric sulfate, ammonium ceric sulfate, and ceric ammonium nitrate.

All of the above-mentioned compounds have the required oxidizing strength in either a basic or acidic medium to oxidize one of the precious metal catalysts mentioned above without substantially degrading the metal pattern or the plastic. In other words, the plastic remains substantially free of cracks, pits, or discoloration, while the metal pattern remains substantially free of pits or other corrosion defects which would degrade the electrical circuit.

In terms of cost, availability, and effectiveness, the preferred oxidizing agents are potassium permanganate, sodium permanganate, sodium hypochlorite, hydrogen peroxide, and ammonium ceric sulfate.

Most of the oxidizing agents are prepared and used in the form of a carrier solution. The particular type of carrier solution depends in part on the particular oxidizing agent employed. The concentration of the oxidizing agent in solution is high enough to oxidize substantially all of the precious metal, but low enough to leave any of the plating metal free from chemical attack. This range is usually from about 0.005 molar to about 0.5 molar, and preferably from about 0.01 molar to about 0.1 molar.

In the case of permanganate oxidizing agents, any metal salt of permanganate that is stable and soluble to the extent of at least 2 grams per liter in water may be used. However, alkali metal salts, e.g., a salt of sodium, potassium, lithium, etc., or alkaline earth metal salts, e.g., a salt of calcium, etc. are preferred, with sodium and potassium permanganate being most preferred, as discussed above. The concentration of the permanganate in solution preferably varies between about 1 to 100 grams per liter and more preferably, between about 5 and 50 grams per liter. Permanganate solutions which are useful in the present invention are also described in U.S. Pat. No. 4,515,829 of Deckert et al., incorporated herein by reference.

In preferred embodiments, the pH of the permanganate solution is high enough to result in oxide formation on the surface of the plated metal. For example, a solution pH which is greater than about 4.0 will result in oxide formation on a copper metal trace, while a solution pH greater than about 7 results in oxide formation on a nickel trace. Oxide formation in general serves to further protect the metal from any degradation during the removal of the precious metal catalyst, but is not critical to this process.

The pH of the permanganate solution can be controlled by the addition of a base, such as ammonium hydroxide, alkali metal hydroxides, and alkaline-earth metal hydroxides. In preferred embodiments, the base has a common ion with the permanganate salt. Sodium and potassium hydroxides are preferred. The concentration of the base is preferably in the range of about 0.5 molar to about 1.5 molar.

Furthermore, it is sometimes desirable to add a buffer to the permanganate solution. Phosphates, borates, and carbonates are examples of suitable buffering compounds. Wetting agents may also be added to improve the wettability of the permanganate treatment solution.

The hypochlorite salts are usually stored and used in solution also, e.g., 5% by volume in water. Since the hypochlorite solution is usually stable under treatment conditions, there is no need to add another base to the solution, as in the case of permanganate.

Peroxide compounds are usually stored, prepared and used in the form of an aqueous solution, such as 3% to about 50% by weight hydrogen peroxide in water. Molybdenum-based compounds are frequently added to the peroxide solution for stabilization.

The ceric compounds are also advantageously used in the form of an aqueous solution, e.g., about 1% to about 10% by weight compound in water.

The temperature of the oxidizing solution is usually maintained between about 20° C. and 75° C. during treatment of the plastic surface. A preferable temperature range is from about 20° C.-30° C.

The oxidizing treatment may be effected either by immersion of the part in solution, or by spraying of the solution onto the surface of the part. The time of contact is in part dependent on the strength of the oxidizing solution, and may vary from about 1 minute to about 20 minutes.

As mentioned above, oxidation of the precious metal is followed by washing away the oxidized material. A water rinse is often sufficient, but can be supplemented by an ultrasonic cleaning with a commercial detergent material, such as 0.1% to about 5% by volume of Micro ® (available from International Products Corporation) in an aqueous solution. Another water rinse usually follows the cleaning with detergent.

In the case of a permanganate oxidizing agent, reduced manganate residue is usually present after the oxidizing step. If desired, this residue may be removed by treatment with an aqueous solution of a strong acid. The concentration of the acid in solution should be high enough to remove substantially all of the manganate residue, but low enough to leave the plastic and any metal applied thereon free from any degradation or corrosion. Illustrative aqueous solutions are concentrated hydrochloric acid at about 0.01 molar to about 1 molar, and sulfuric acid at about 0.01 molar to about 3 molar.

The aqueous solution containing the acidic compound may also include a reducing agent which increases the solubility of reduced manganate in water. Exemplary reducing agents for this purpose include hydroxylamine; stannous compounds such as stannous bromide, stannous chloride, or stannous sulfate, and bisulfite compounds such as sodium bisulfite or potassium bisulfite. The reducing agent is usually present at about 0.01 molar to 1 molar, and most preferably, from about 0.05 molar to 0.5 molar.

Some reducing agents, such as hydroxylamine, may be used in a basic solution, e.g., one comprising 1N potassium or sodium hydroxide. Treatment with the reducing agent solution could in fact be carried out after treatment with the aqueous acid, if desired.

A detergent compound such as the Micro ® material mentioned above may be included in the aqueous solution. An illustrative, commercially available material containing detergent, reducing agent, and acid is the Shipley Circuposit ® MLB216, available from the Shipley Company.

The use of oxidizing agents other than the manganate-based compounds does not usually require washing with the acidic compound and the reducing agent. Normally, oxidation with these other agents is followed by only a water rinse.

Those of ordinary skill in the art can determine the appropriate treatment times for the washing steps. Usually, about 1-5 minutes is sufficient for each step.

This invention includes within its scope a method for the plating and patterning of metal on a plastic substrate, in which residual precious metal catalyst is removed from the substrate surface. Methods for applying metal by electroless plating are disclosed in the applications of Dumas et al., Ser. No. 947,116, filed Dec. 29, 1986 now U.S. Pat. No. 4,775,449; Foust et al., Ser. No. 103,618, filed Sept. 28, 1987; and the application of Donald F. Foust and Edward J. Lamby, Ser. No. 207,462, filed June 16, 1968, all of which are assigned to the assignee of the present invention and incorporated herein by reference. The substrate is usually a polyimide material, one class of which is commonly referred to as the "polyetherimides". Other thermoplastic substrates may also be used, such as polycarbonate, polysulfone, polyphenylene oxide, polyphenylene sulfide, and polyester. Moreover, while the substrate may have a flat surface, it can also include various cavities, raised regions, and through-holes; and can comprise two or more plastic layers.

For a polyimide substrate, effective amounts of an adhesion-promoting compound such as thiourea are often used to treat the surface prior to plating, as disclosed in Ser. No. 103,618. Furthermore, when the polyimide contains a filler, its surface is often pretreated prior to treatment with the adhesion-promoting compound, via mild etching, washing with a basic solution, and then treatment with a solution of a mild etching compound and an alcohol or water mixture.

Another suitable pretreatment prior to treatment with the adhesion-promoting compound is disclosed in the above-referenced Ser. No. 207,462, and calls for exposure of the surface layer of the plastic to concentrated acid, followed by exposure to a strong aqueous base. The surface is then contacted with an aqueous solution of a long chain cationic surfactant such as dodecyltrimethylammonium bromide, followed by a water rinse.

After treatment of the plastic surface by exposure to the adhesion-promoting compound, the substrate may be thoroughly rinsed with water or with an alcohol solution, and then activated for plating by methods well-known in the art and described, for example, in U.S. Pat. No. 3,589,916, incorporated herein by reference. An exemplary treatment involves contact with an acid solution of a precious metal, such as palladium chloride in hydrochloric acid, for a period of time sufficient to cause catalytic activation of the substrate. Various additives may be used during the activation step, such as those which aid in absorption of the plating catalyst, as described in several of the abovereferenced applications. Typical activation and plating processes suitable for the present invention are also described in W. T. Grubb et al., Ser. No. 944,728, filed Dec. 22, 1986, and incorporated herein by reference. The use of colloidal suspensions of precious metals is also discussed in U.S. Pat. Nos. 3,011,920 and 3,841,881, issued to Shipley and Feldstein et al., respectively, both of which are incorporated herein by reference.

After activation of the substrate and the subsequent water rinse, electroless plating can be undertaken. As disclosed in Ser. No. 103,618 of Foust et al., various metals may be used to form the metallization layer, such as copper, palladium, nickel, and gold. Electroless baths are well-known in the art and are generally described in the Kirk-Othmer Encyclopedia of Chemical Technology, Third Edition, Volume 8, the contents of which are incorporated herein by reference. The selection of a particular bath or electroless plating process is not critical to the present invention. The contents of the bath and the particular plating parameters, e.g., temperature, pH, and immersion time, will of course depend on the particular polyimide serving as the substrate, and also upon the particular metal being deposited thereon. Suitable plating baths include the Shipley Cuposit ® 250 system and the Enthone ® 406 system, available from Shipley Corporation and Enthone Corporation, respectively, as well as those described in the Grubb et al. and Dumas et al. applications mentioned above.

After electroless deposition of the metal to a desired thickness, the plastic surface, especially when polyimide, can be heated at a temperature ranging from about 60° C. to about 170° C. for about 5 minutes to about 120 minutes, as described in Ser. No. 103,618 of Foust et al.

The electroless-plated surface may then be patterned by application of a photoresist which is then imaged and developed by methods well-known in the art. Patterning techniques are described, for example, in U.S. Pat. No. 3,562,005, issued to DeAngelo et al. and incorporated herein by reference. Another patterning technique suitable for use herein is disclosed in the copending Grubb et al. application discussed above.

As mentioned previously, a tin/lead mixture may be used as an etching mask after etching and removal of the photoresist to produce the desired circuit pattern. A general discussion of some suitable etch resists and masks is provided by W. Sepp in Printed Circuit Fabrication, August, 1986, pages 52-61, he contents of which are incorporated herein by reference. The patterning steps may be postponed until after the deposition of more metal by electroplating, if desired.

The precious metal catalyst removal technique of this invention can in fact be used several times during the entire printed circuit fabrication process: after the patterning steps but before electroplating; and/or after electroplating has been completed. The technique can of course be used on more than one surface of a circuit board, e.g., if both a top and bottom surface are being patterned and plated. As described above, substantially all of the precious metal catalyst can be removed without substantially degrading the plastic surface, the metallic material, or the etching mask compound.

Electroplating is the preferred application method for additional metal layers deposited on top of the electrolessly deposited layer. The substrate is usually cleaned prior to immersion in the electroplating bath. These baths are well-known in the art and are described, for example, in U.S. Pat. No. 4,555,315, incorporated herein by reference. The particular electroplating bath is not critical to the present invention. Furthermore, those skilled in the art appreciate that the particular bath contents will depend on various factors, such as the particular plastic serving as the substrate, and the particular metal being deposited thereon. Usually, the electroplating bath is operated at a temperature ranging from about 16° C. to about 70° C., with a cathode current density in the range of about 1 ASF to about 80 ASF. A description of such baths is given in the KirkOthmer reference described above, in Volume 8, beginning on page 826.

The final step in the plating process is often another heat treatment, as described in Ser. No. 103,618 of Foust et al. Typically, the composite article is heattreated for about 15 minutes to about 48 hours at a temperature in the range of about 25° C. to about 170° C. This heat treatment in some instances reduces the time required to produce optimal adhesion between the substrate and the metal deposited thereon.

It should be apparent from above that the metal applied to the plastic substrate is often in the form of a pattern rather than a continuous layer.

The following specific examples provide novel embodiments of the present invention. They are intended for illustrative purposes only and should not be construed as a limitation upon the broadest aspects of the invention. All liquid ratios are by volume, while all other ratios are by weight, unless otherwise indicated.

The presence of palladium and other elements on the plastic surface was measured by x-ray photoelectron spectroscopy (XPS), by resistivity measurements, or by immersion in an electroless tin or electrolytic Watts nickel bath. In regard to the plating bath test, residual palladium is detected by the occurrence of nickel or tin dendrites or whiskers across the plastic surface.

EXAMPLE 1

Samples 1–4 relate to one article in various treatment stages according to the present invention.

Sample 1 was a substrate formed from a filled polyetherimide material (30% glass) which was treated with an adhesion promoter in the form of a thiourea solution. Steps A-O of Example 1 of Ser. No. 103,618 of Foust et al. were used to treat the polyetherimide substrate, the last step being catalysis with Shipley Cataposit ® 44, a tin/palladium colloidal catalyst system. Sample 2 represents the same article after the oxidation treatment of the present invention.

The oxidation treatment used for these samples was as follows:

| Step | Procedure[a] | Time (minutes) |
|---|---|---|
| A | 60 grams/liter potassium permanganate, 1.2 N potassium hydroxide at 75° C. | 15 |
| B | Water rinse | 2 |
| C | Hydrochloric acid, 2% by weight | 1 |
| D | Water rinse | 2 |
| E | Ultrasonic cleaning, Micro ® (2.5 volume %) | 1 |
| F | Water rinse | 2 |

[a]Substrate was immersed in the liquid components.

Sample 3 represents the condition of the sample after the hydrochloric acid wash of Step C above.

Sample 4 represents the sample after the cleaning step and water rinse of steps E and F.

Table 2 below represents the chemical element analysis on the substrate surface after each stage in the treatment of the sample. Analysis was under taken using a Surface Science X-ray Photoelectron Spectroscopic Analyzer, Model SSX-100, available from the Instrument Division of Kevex Corporation.

TABLE 2
Analysis of Substrate Surface

| Sample | Explanation | Surface Composition, Atomic % | | | | | |
|---|---|---|---|---|---|---|---|
| | | C | O | N | Sn | Pd | Mn |
| Control | Untreated Plastic[a] | 83 | 13 | 4 | — | — | — |
| 1 | After catalysis | 45 | 39 | — | 13 | 2 | — |
| 2 | After KMnO$_4$ | 52 | 25 | 1 | 0.7 | 1 | 5 |
| 3 | After HCl wash | 70 | 21 | 2.5 | 0.4 | — | 4 |
| 4 | After detergent and rinse | 78 | 16 | 3.1 | — | — | — |

[a]Theoretical composition of polyetherimide prior to any type of treatment.

The presence of tin and palladium from the catalyst system is shown in Sample 1, along with the expected presence of carbon and oxygen. Following treatment with permanganate (Sample 2) the palladium concentration is diminished, and all that is still present is in the oxidized, divalent state. The tin concentration is also greatly reduced.

Sample 3 (after the HCl wash) shows the removal of all oxidized palladium, and a decrease in the reduced permanganate material.

The detergent and rinsing steps removed any residual contaminants, e.g., the permanganate (see Sample 4), yielding an XPS spectrum consistent with that of the polyetherimide itself.

Examples 2–7 describe other embodiments of this invention, using various treatment agents to remove the residual precious metal catalyst. In each example, a filled polyetherimide substrate (30% glass) was electrolessly-plated with copper according to the process described in the above-referenced application Ser. No. 207,462, using the same tin/palladium catalyst system used in Example 1, above. The electroless-plated boards were then patterned with a resist and electroplated to a copper thickness of about 1 mil, using a Sel-Rex Cu-M copper bath, followed by the application of a tin/lead etch resist. Following the removal of the resist in a caustic solution, electroless-copper etching was undertaken, using an ammoniacal copper etchant.

EXAMPLE 2—Use of Potassium Permanganate Solution

| Step | Procedure[a] | Time (minutes) |
|---|---|---|
| A | KMnO$_4$ (15 g/l), 1.2 N KOH, 25° C. | 15 |
| B | Water Rinse | 2 |
| C | HCl, 2% by weight | 1 |
| D | Water Rinse | 2 |
| E | Ultrasonic clearing with Micro ®, 2.5 vol. % | 1 |

| Step | Procedure[a] | Time (minutes) |
|---|---|---|
| F | Water Rinse | 2 |

[a]Treatment by immersion of the substrate.

EXAMPLE 3

Use of Potassium Permanganate and Commerical Detergent/Reducer Solution

| Step | Procedure[a] | Time (minutes) |
|---|---|---|
| A | $KMnO_4$ (15 g/l), 1.2 N KOH, 25° C. | 15 |
| B | Water Rinse | 2 |
| C | Shipley Circuposit ® MLB216[b], 50° C. | 5 |
| D | Water Rinse | 2 |

[a]Treatment by immersion of the substrate.
[b]Contains detergent, surfactants, reducing agent, and acid.

EXAMPLE 4

Use of Potassium Permanganate and Hydroxylamine Reducer Solution

| Step | Procedure[a] | Time (minutes) |
|---|---|---|
| A | $KMnO_4$ (15 g/l), 1.2 N KOH, 25° C. | 15 |
| B | Water Rinse | 2 |
| C | Hydroxylamine hydrochloride, 7% by weight in 1 N NaOH, 25° C. | 5 |
| D | Water Rinse | 2 |

[a]Treatment by immersion of the substrate.

EXAMPLE 5

Use of Commercial Bleach Solution

| Step | Procedure[a] | Time (minutes) |
|---|---|---|
| A | Sodium hypochlorite, 5% by volume in water, 25° C. | 10 |
| B | Water Rinse | 2 |

[a]Treatment by immersion of the substrate.

EXAMPLE 6

Use of Hydrogen Peroxide

| Step | Procedure[a] | Time (minutes) |
|---|---|---|
| A | Hydrogen peroxide, 30% by weight, 25° C. | 10 |
| B | Water Rinse | 2 |

[a]Treatment by immersion of the substrate.

EXAMPLE 7 Use of Ceric Sulfate Salt

| Step | Procedure[a] | Time (minutes) |
|---|---|---|
| A | Saturated aqueous solution of ammonium ceric sulfate, 25° C. | 10 |
| B | Water Rinse | 2 |

[a]Treatment by immersion of the substrate.

Each of the samples in Examples 2-7 were then electroplated with nickel, using a Watts nickel bath operating at 20 ASF and 52° C. for 6 minutes. Examination of each of these samples showed no dendritic growth between any of the metallic traces, indicating that the residual palladium catalyst had been completely removed from the surface. Furthermore, the plastic surface and the copper pattern appeared to be free from any degradation. Moreover, the tin/lead mixture used in the etching step did not suffer any damage during the oxidation treatment. In Example 5, the bleach compound appeared to darken the tin/lead plate, but it was found to brighten again if subsequently cleaned with a commercial tin/lead cleaner.

It will be further understood that the foregoing examples are illustrative only, and that variations and modifications may be made without departing from the scope of this invention. For example, the various rinsing, drying and cleaning steps set forth in the above examples may be adjusted and sometimes omitted by those of ordinary skill in the art, depending on the condition of the substrate and on the other process parameters discussed above.

What is claimed is:

1. A method for removing residual precious metal catalyst from a polyimide, polycarbonate, polysulfone, polyphenylene oxide, polyphenylene sulfide or polyester surface having a metal plated on at least a portion thereof, comprising oxidation of the precious metal without substantial degradation of the plated metal by a reagent which, as incorporated into an aqueous solution, has a standard potential equal to or greater than the standard potential for the half-reaction of the precious metal under a pH influence corresponding to the pH of said aqueous solution, said reagent being a permanganate salt, a hypochlorite salt, hydrogen peroxide, peroxide salt or a ceric salt, followed by washing away the oxidized precious metal.

2. The method of claim 1 wherein the precious metal catalyst is palladium, and the oxidizing agent is a permanganate salt.

3. The method of claim 2 wherein the permanganate salt is used in the form of a solution having a pH high enough to cause oxide formation on the surface of the plated metal.

4. The method of claim 3 wherein the plated metal is copper, and the pH of the solution is greater than about 4.0.

5. The method of claim 1 wherein the concentration of the oxidizing agent in solution is high enough to oxidize substantially all of the precious metal, but low enough to leave the plated metal free from chemical attack.

6. The method of claim 5 wherein the concentration of the oxidizing agent is about 0.005 molar to about 0.5 molar.

7. The method of claim 6 wherein the concentration is about 0.01 molar to 0.1 molar.

8. The method of claim 5 wherein the solution containing the oxidizing agent is maintained at a temperature between about 20° C. and 75° C. during treatment of the plastic surface.

9. The method of claim 8 wherein the temperature is about 20° C.-30° C.

10. The method of claim 5 wherein the solution contains the metal salt of permanganate as the oxidizing agent, along with a base having a common ion with said salt.

11. The method of claim 10 wherein the concentration of the metal salt of permanganate is in the range of about 0.005 molar to about 0.5 molar; and the concentration of the base is about 0.5 molar to about 1.5 molar.

12. The method of claim 11 wherein the metal salt is potassium permanganate, and the base is potassium hydroxide.

13. The method of claim 1 wherein the washing is a water rinse of the metal-plated surface.

14. The method of claim 13 wherein the washing comprises treatment with an aqueous solution of a strong acid.

15. The method of claim 14 wherein the aqueous solution contains about 0.01 molar to about 1 molar of hydrochloric acid.

16. The method of claim 15 wherein the aqueous solution further includes a reducing agent capable of solubilizing residual permanganate.

17. The method of claim 16 wherein the reducing agent is selected from the group consisting of stannous compounds, bisulfite compounds and hydroxylamine; and is present in the aqueous solution at about 0.01 molar to 1 molar.

18. The method of claim 16 wherein the aqueous solution further includes a detergent.

19. The method of claim 1 wherein the plastic is a polyetherimide.

20. The method of claim 19 wherein the precious metal catalyst is selected from the group consisting of gold, platinum, palladium, and silver.

21. The method of claim 20 wherein the palladium catalyst is in the form of a colloidal suspension which also includes tin.

22. In a method for applying metal on the surface of a plastic substrate, wherein the plastic is a polyimide, polycarbonate, polysulfone, polyphenylene oxide, polyphenylene sulfide or polyester, by electroless plating of the metal through the use of a precious metal catalyst, the improvement which comprises oxidation of residual precious metal catalyst on the surface of said plastic after electroless plating by a reagent which, as incorporated into an aqueous solution, has a standard potential equal to or greater than the standard potential for the half-reaction of the precious metal under a pH influence corresponding to the pH of said aqueous solution, said reagent being a permanganate salt, a hypochlorite salt, hydrogen peroxide, peroxide salt or a ceric salt, followed by washing away the oxidized precious metal catalyst.

23. The method of claim 22 wherein the electroless-plated metal is copper; the substrate is formed of a polyimide material; the precious metal is palladium; and the oxidizing agent is potassium permanganate incorporated into an aqueous solution which also includes potassium hydroxide in an amount sufficient to provide a solution pH of at least about 4.0.

* * * * *